(12) United States Patent
Nakako et al.

(10) Patent No.: US 9,676,969 B2
(45) Date of Patent: Jun. 13, 2017

(54) COMPOSITION SET, CONDUCTIVE SUBSTRATE AND METHOD OF PRODUCING THE SAME, AND CONDUCTIVE ADHESIVE COMPOSITION

(75) Inventors: Hideo Nakako, Tsukuba (JP);
Kazunori Yamamoto, Tsukuba (JP);
Yasushi Kumashiro, Chikusei (JP);
Shunya Yokosawa, Tsukuba (JP);
Takaaki Noudou, Chikusei (JP); Maki Inada, Tsukuba (JP); Kyoko Kuroda, Chikusei (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 247 days.

(21) Appl. No.: 14/236,343

(22) PCT Filed: Jul. 30, 2012

(86) PCT No.: PCT/JP2012/069376
§ 371 (c)(1),
(2), (4) Date: May 13, 2014

(87) PCT Pub. No.: WO2013/018777
PCT Pub. Date: Feb. 7, 2013

(65) Prior Publication Data
US 2014/0242362 A1 Aug. 28, 2014

(30) Foreign Application Priority Data

Aug. 3, 2011 (JP) .................................. 2011-170083

(51) Int. Cl.
| | | |
|---|---|---|
| H01B 1/00 | (2006.01) |
| B05D 5/12 | (2006.01) |
| C09J 9/00 | (2006.01) |
| C09J 9/02 | (2006.01) |
| C09J 11/04 | (2006.01) |
| H01B 1/22 | (2006.01) |
| H05K 3/38 | (2006.01) |
| C09J 7/02 | (2006.01) |
| H01B 13/00 | (2006.01) |
| H05K 3/10 | (2006.01) |
| H05K 1/09 | (2006.01) |
| H05K 3/12 | (2006.01) |
| H05K 1/03 | (2006.01) |
| C08K 3/08 | (2006.01) |

(Continued)

(52) U.S. Cl.
CPC ........ C09J 9/02 (2013.01); B05D 5/12 (2013.01); C09J 7/0292 (2013.01); C09J 11/04 (2013.01);
(Continued)

(58) Field of Classification Search
CPC ..... H01B 1/00; H01B 1/14; H01B 1/20; H01B 13/00; C09J 9/02; C09J 11/04; B05D 5/12
See application file for complete search history.

(56) References Cited

U.S. PATENT DOCUMENTS 7,718,730 B2 * 5/2010 Roesler ................. C08G 18/10
156/327
8,574,032 B2 * 11/2013 Norville ................. B24B 1/00
427/140

(Continued)

FOREIGN PATENT DOCUMENTS

| CN | 1604726 A | 4/2005 |
|---|---|---|
| CN | 101903959 A | 12/2010 |

(Continued)

OTHER PUBLICATIONS

EP Search report of Appln. 12819743.1 dated Feb. 12, 2015 in English.

(Continued)

*Primary Examiner* — Mark Kopec
(74) *Attorney, Agent, or Firm* — Fitch, Even, Tabin & Flannery, LLP

(57) ABSTRACT

The invention provides a composition set comprising: a conductor layer-forming composition comprising a dispersing medium and inorganic particles comprising a metallic oxide; and a conductive adhesive composition comprising a binder and conductive particles having a number average particle size of from 1 nm to 3000 nm.

18 Claims, 2 Drawing Sheets

(51) Int. Cl.
  *C08K 3/22* (2006.01)
  *C08K 7/18* (2006.01)
(52) U.S. Cl.
  CPC ............... *H01B 1/22* (2013.01); *H01B 13/00* (2013.01); *H05K 3/105* (2013.01); *H05K 3/1208* (2013.01); *H05K 3/38* (2013.01); *C08K 3/08* (2013.01); *C08K 3/22* (2013.01); *C08K 7/18* (2013.01); *C09J 2201/602* (2013.01); *C09J 2203/326* (2013.01); *C09J 2205/102* (2013.01); *H05K 1/0306* (2013.01); *H05K 1/095* (2013.01); *H05K 1/097* (2013.01); *H05K 3/1283* (2013.01); *H05K 2203/1157* (2013.01); *Y10T 428/24967* (2015.01); *Y10T 428/25* (2015.01)

(56) References Cited

U.S. PATENT DOCUMENTS

| | | | | |
|---|---|---|---|---|
| 2005/0079707 | A1* | 4/2005 | Tsukahara | H05K 3/247 438/652 |
| 2009/0081431 | A1* | 3/2009 | Mattila | B82Y 10/00 428/213 |
| 2009/0202747 | A1 | 8/2009 | Yukinobu et al. | |
| 2011/0006393 | A1* | 1/2011 | Cui | H01G 4/206 257/532 |
| 2012/0170241 | A1* | 7/2012 | Nakako | C09D 11/52 361/783 |

FOREIGN PATENT DOCUMENTS

| | | |
|---|---|---|
| EP | 0131778 | 1/1985 |
| EP | 0546560 | 6/1993 |
| EP | 2234119 | 9/2010 |
| JP | 2004-273205 A | 9/2004 |
| JP | 3599950 B2 | 12/2004 |
| JP | 2005-101436 A | 4/2005 |
| JP | 2008-69374 A | 3/2008 |
| JP | 2008-200557 A | 9/2008 |
| WO | 02/082465 | 10/2002 |
| WO | 02082465 | 10/2002 |

OTHER PUBLICATIONS

Office Action of TW Appln. No. 10520285410 mailed Mar. 11, 2016 with partial English translation.
European Search Report dated Feb. 12, 2015, in Application No. 12819743.1.
Office Action of CN Appln. No. 201280038407.2 dated Aug. 13, 2015 with partial English translation.

* cited by examiner

COMPOSITION SET, CONDUCTIVE SUBSTRATE AND METHOD OF PRODUCING THE SAME, AND CONDUCTIVE ADHESIVE COMPOSITION

TECHNICAL FIELD

The present invention relates to a composition set, a conductive substrate and a method of producing the same, and a conductive adhesive composition.

BACKGROUND ART

A printing method is regarded as a promising method for forming a wiring pattern, in view of its favorable aspects including low energy, low cost, high throughput and on-demand production. This purpose can be realized by a method including forming a pattern by a printing method using an ink paste containing a metal element, and then imparting metallic conductivity to the printed wiring pattern.

For this purpose, a conductive paste in which silver or copper in flake form is mixed with a binder such as a thermoplastic resin or a thermosetting resin, an organic solvent, and if necessary, a curing agent, a catalyst or the like, has been used. The conductive paste is used by applying the same onto an object with a dispenser or by screen printing, and then curing the binder resin by drying at normal temperature or heating at approximately 150° C. to form a conductive coating. In the obtained conductive coating, only some of the metal particles existing therein are in physical contact with each other so as to establish conduction, and a cured resin gives rise to the strength of the electrically conductor layer and the adhesion with respect to a substrate.

However, in this conductive paste, conduction is established by physical contact of the particles, and a binder remains partly between silver particles and inhibits the contact. Therefore, the volume resistivity is, although it depends on the conditions for formation of the coating, in a range of from $10^{-6}$ $\Omega \cdot m$ to $10^{-7}$ $\Omega \cdot m$, which is from 10 to 100-fold greater than the volume resistivity of metallic silver or metallic copper, namely from $16 \times 10^{-9}$ $\Omega \cdot m$ and $17 \times 10^{-9}$ $\Omega \cdot m$, indicating a much inferior conductivity compared to a metal film. In addition, silver particles used in a conventional silver paste are in the form of a flake having a particle size of from 1 μm to 100 μm, and cannot be used for forming a wiring line having a width of not greater than the particle size of the silver particles. Consequently, the conventional silver paste is not suitable for forming a fine wiring pattern.

In order to overcome the drawbacks of a conductive paste including silver or copper, a wiring pattern formation method in which metallic nanoparticles are used has been investigated, and a method in which nanoparticles of gold or silver are used has been established (see, for example, Japanese Patent Application Laid-Open (JP-A) No. 2004-273205). However, use of nanoparticles of a noble metal such as gold or silver increases the price of the material itself, and the production cost of a dispersion for ultrafine printing is also increased, which inhibits a wide diffusion of the same as a general-purpose product from economic aspects. In addition, in a case of silver nanoparticles, a further problem arises in that insulation between the circuits may deteriorate due to electromigration as the wire width or the space between the wires becomes narrower.

Copper is less likely to cause electromigration and less expensive as compared with gold or silver, and is expected to serve as a material for a metal nanoparticle dispersion used for wiring formation. As a nanoparticle dispersion including copper, a dispersion in which metallic copper nanoparticles are dispersed in a dispersing agent (see, for example, Japanese Patent (JP-B) No. 3599950) and a dispersion in which copper oxide nanoparticles are dispersed in a high polarity organic solvent have been known.

Incidentally, while a conductive paste, in which a metal flake is mixed with a resin binder, can be bonded to a substrate by means of adhesion of the binder resin, a metal nanoparticle dispersion, which does not include a binder resin, has a problem in terms of adhesion with respect to a substrate.

One solution to the problem is to add a resin in order to increase adhesion. However, in this case, another problem arises in that the resin existing between metal nanoparticles may prevent mutual contact or fusion of the metal nanoparticles, thereby causing an increase in the volume resistivity of the conductor layer. In view of this, an attempt has been made in order to improve the adhesive property by modifying a resin of a substrate (see, for example, JP-A No. 2008-200557).

SUMMARY OF THE INVENTION

Technical Problem

However, modification of a resin of a substrate is not applicable to a substrate made of an inorganic material or a metal. The invention has been made in view of the circumstances, and aims to accomplish the following object.

An object of the present invention is to provide a conductive adhesive composition that exhibits high adhesion between a substrate having conductivity at its surface and a conductor layer formed from a dispersion of metal-containing particles, and secures conduction between the conductor layer and the substrate; a composition set including the composition; and a conductive substrate produced from the composition or the composition set and the method of producing the conductive substrate.

Solution to Problem

The invention includes the following aspects:

(1) A composition set comprising: a conductor layer-forming composition comprising a dispersing medium and inorganic particles comprising a metallic oxide (hereinafter, also referred to as an "conductive ink"); and a conductive adhesive composition comprising a binder and conductive particles having a number average particle size of from 1 nm to 3000 nm.

(2) The composition set according to (1), wherein the inorganic particles comprising the metallic oxide are at least one selected from the group consisting of copper oxide particles and core-shell particles having a core of metallic copper and a shell of copper oxide.

(3) The composition set according to (1) or (2), wherein the conductive particles comprise at least one selected from the group consisting of copper, copper oxide, cuprous oxide, gold, gold oxide, platinum, platinum oxide, silver, silver oxide, palladium, palladium oxide, rhodium, rhodium oxide, nickel and nickel oxide.

(4) The composition set according to any one of (1) to (3), wherein the binder is an organic binder, an inorganic binder, or a combination thereof.

(5) The composition set according to any one of (1) to (4), wherein the binder is at least one organic binder selected from the group consisting of an epoxy resin, a polyimide resin, a polyamide resin, a polyamide-imide resin, a phenolic resin, an isocyanate resin, an acrylic resin, a resol resin, a siloxane resin and precursor compounds of these.

(6) The composition set according to any one of (1) to (4), wherein the binder is at least one inorganic binder selected from the group consisting of silicon oxide, titanium oxide, zircon oxide, tungsten oxide, zinc oxide, chromium oxide and precursor compounds of these.

(7) A conductive substrate, comprising: a substrate having a conductive film; a conductive adhesive layer provided on the conductive film, the conductive adhesive layer being a cured product of a conductive adhesive composition comprising a binder and conductive particles having a number average particle size of from 1 nm to 3000 nm; and a conductor layer provided on the conductive adhesive layer, the conductor layer comprising a metal that is a reduced product of a conductor layer-forming composition comprising a dispersing medium and inorganic particles comprising a metallic oxide.

(8) The conductive substrate according to (7), wherein the conductor layer comprises metallic copper.

(9) The conductive substrate according to (7) or (8), wherein the conductive film comprises at least one selected from the group consisting of aluminum, copper, silver, gold, platinum, nickel, tin, lead, palladium, indium tin oxide (ITO), indium zinc oxide (IZO), zinc tin oxide (ZTO), fluorine-doped tin oxide (FTO), $InO_2$, $SnO_2$ and ZnO.

(10) The conductive substrate according to any one of (7) to (9), wherein the conductor layer has a volume resistivity of from $1.5 \times 10^{-8}$ Ω·m to $1.0 \times 10^{-7}$ Ω·m, and wherein at least a part of the metal in the conductor layer is bonded by metal bonding with at least some of the conductive particles in the conductive adhesive layer.

(11) The conductive substrate according to any one of (7) to (10), wherein the average thickness of the conductor layer is 100 nm or more, and the average thickness of the conductive adhesive layer is from 10 nm to 2000 nm.

(12) A method of producing the conductive substrate according to any one of (7) to (11), the method comprising: a process of forming a conductive adhesive composition layer by applying, onto a substrate having a conductive film, a conductive adhesive composition comprising a binder and conductive particles having a number average particle size of from 1 nm to 3000 nm; a process of forming a conductive adhesive layer by curing the binder in the conductive adhesive composition layer; a process of forming a conductor layer-forming composition layer by applying, onto the conductive adhesive layer, a conductor layer-forming composition comprising a dispersing medium and inorganic particles comprising a metallic oxide; and a process of forming a conductor layer comprising a metal by reducing the metallic oxide in the conductor layer-forming composition layer.

(13) A conductive adhesive composition that is used for the composition set according to any one of (1) to (6), and comprises a binder and conductive particles having a number average particle size of from 1 nm to 3000 nm.

(14) A conductive adhesive composition that is used for the method according to (12), and comprises a binder and conductive particles having a number average particle size of from 1 nm to 3000 nm.

Effect of the Invention

According to the invention, it is possible to provide a conductive adhesive composition, which can exhibit a high adhesion between a substrate having conductivity at its surface and a conductor layer that is formed from a dispersion of metal-containing particles, and secures conduction between the conductor layer and the substrate; a composition set including the composition; and a conductive substrate produced from the composition or the composition set and the method of producing the conductive substrate.

EMBODIMENTS FOR IMPLEMENTING THE INVENTION

Figure 1:
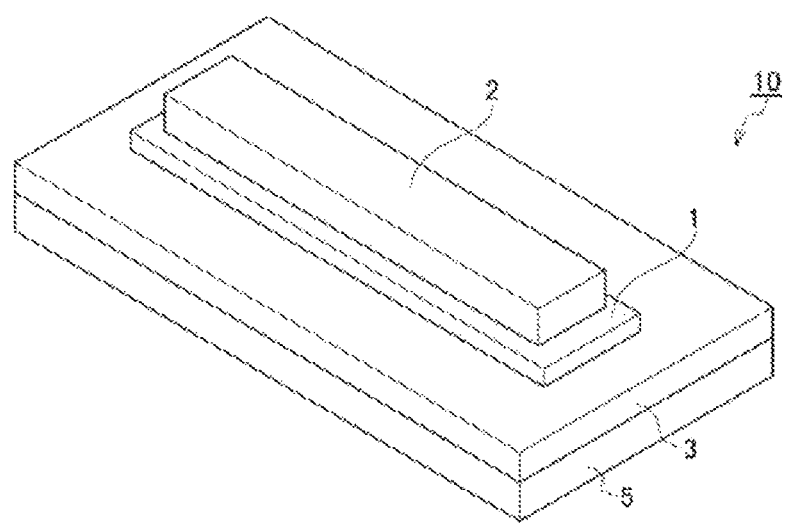
FIG. 1 is a perspective view showing schematically an example of a conductive substrate according to the present embodiment.

In the present description, the expression "process" includes not only an independent process but also a process that cannot be clearly distinguished from another process, as long as the intended purpose of the process is achieved. The numerical range expressed by "from x to y" includes the values of x and y as the minimum and maximum values, respectively. When there are plural substances that correspond to a component, the amount of the component refers to the total amount of the substances in the composition, unless otherwise specified.

<Composition Set>

The composition set according to the invention includes at least one conductor layer-forming composition (conductive ink) that includes a dispersing medium and inorganic particles containing a metallic oxide; and at least one conductive adhesive composition that includes a binder and conductive particles having a number average particle size of from 1 nm to 3000 nm. The composition set may further include other components, if necessary.

By forming a conductor layer on a substrate such that a conductive adhesive layer is formed between the conductor layer and the substrate, with the composition set including a conductor layer-forming composition and a conductive adhesive composition that includes a binder and conductive particles having a number average particle size of from 1 nm to 3000 nm, excellent adhesion between the conductor layer and the substrate surface can be achieved even if there is a conductive film on the substrate surface, and excellent conduction between the conductor layer and the conductive film can be secured. The reason for this is thought to be as follows.

Since the number average particle size of the conductive particles in the conductive adhesive composition is within a specific range and highly small, the thickness of the conductive adhesive layer can be significantly reduced, and deterioration in conductivity due to the binder can be suppressed. Further, some of the conductive particles in the conductive adhesive layer are likely to bond by metal bonding with a metal included in the conductor layer as a conductive component. Therefore, it is thought that an intended adhesion can be obtained owing to the interaction of the adhesion derived from the binder and the adhesion derived from the metal bonding, even if the conductive adhesive layer has a small thickness.

[Conductive Adhesive Composition]

A conductive adhesive composition according to the invention is a liquid that includes a binder and conductive particles having a number average particle size of from 1 nm to 3000 nm, and is used as a constituting element of the composition set. Also, the conductive adhesive composition is used in a method of producing a conductive substrate as described below. Therefore, the conductive adhesive composition is used, for example, for imparting adhesion and conduction with a substrate having a conductive film. In other words, another aspect of the invention is use of a conductive adhesive composition including a binder and conductive particles having a number average particle size of from 1 nm to 3000 nm in a composition set. Another aspect of the invention is use of a conductive adhesive composition including a binder and conductive particles having a number average particle size of from 1 nm to 3000 nm in a method of producing a conductive substrate.

The conductive adhesive composition (hereinafter, also referred to as an "conductive adhesive layer-forming liquid") is preferably a liquid that includes a binder and conductive particles containing a transition metal, a transition metal oxide or the like, and optionally a solvent. The conductive adhesive composition is applied onto a substrate by coating or printing to form a conductive adhesive layer, and a conductor layer, which is formed from a conductive ink described later, is provided on the conductive adhesive layer. Details of the conductive ink are described later, and a conductive ink containing copper (hereinafter, also referred to as a "copper conductive ink") is preferable. For example, a conductor layer is formed by printing a copper conductive ink and then performing a conductivity developing treatment on the copper conductive ink. As the conductivity developing treatment, a conductivity developing treatment including heating in the presence of a formic acid gas, or a treatment including applying a solution containing an agent that allows a copper oxide to ionize or to form a complex and a reducing agent that reduces the copper ion or the copper complex to give metallic copper (hereinafter, also referred to as a "reducing treatment solution"), is preferable. After the coating or printing of the conductive adhesive composition, part or all of a binder or a precursor thereof in the conductive adhesive composition may be cured by heating. Through the process, adhesion can be imparted while maintaining conduction between a substrate as a base and a conductor layer formed from a conductive ink.

The conductive adhesive composition preferably has a dynamic viscosity at 25° C. of from 1 mPa·s to 400,000 mPa·s, so that the composition can be applied onto a substrate by coating or printing. In the case of performing printing by ink jet printing, in particular, the dynamic viscosity is preferably from 5 mPa·s to 20 mPa·s. The dynamic viscosity can be measured by a viscoelasticity measuring apparatus (for example, PHYSICA MCR-501, by Anton Paar GmbH). Specifically, a conical measurement tool (CP50-1) with an angle of 1° and a diameter of 50 mm is attached to the measuring apparatus and a conductive adhesive composition is charged in the measuring apparatus at a measuring position such that the conductive adhesive composition spills over from the measurement tool. The spillover of the conductive adhesive composition from the measurement tool upon lowering the measurement tool to the measuring position to set is removed, and the measurement is carried out. The measurement is carried out after 10 minutes of still standing for equalizing the initial conditions from the setting of the conductive adhesive composition, at a temperature of 25° C. and a shear rate of 0.5 s$^{-1}$.

Examples of the method for coating for applying a conductive adhesive composition include a spin coater method, a spray coater method, an ink jet coater method, a bar coater method, a gravure coater method, a knife coater method, a die coater method, a comma coater method, a slit coater method, an applicator method, and a dip coating method.

Examples of the method for printing for applying a conductive adhesive composition only at a desired portion include an ink jet printing method, a dispenser method, a needle dispenser method, a letterpress printing method, an intaglio printing method, a gravure printing method, a screen printing method, a jet printing method, a transfer printing method, and an offset printing method.

From the viewpoint of suppressing the thickness unevenness caused by flowage of the conductive adhesive composition, the conductive adhesive composition layer, formed by applying the conductive adhesive composition onto a substrate by coating or printing, is preferably dried by allowing to stand at normal temperature, heating, or reducing pressure, prior to performing the subsequent process.

From the viewpoint of preventing a binder in the conductive adhesive composition from migrating into a conductive ink layer upon application of the conductive ink (for example, printing) and inhibiting development of conductivity, the binder is preferably made into a semi-cured state or a cured state by heating. The heating temperature depends on the curing temperature of the binder and the desired degree of curing, and is preferably from 100° C. to 300° C. From the viewpoint of heat resistance of the material, the heating temperature is more preferably from 100° C. to 200° C., and from the viewpoint of reactivity of the binder, the heating temperature is further preferably from 130° C. to 200° C.

There is no particular restriction on the average thickness of the conductive adhesive layer formed from the conductive adhesive composition. From the viewpoint of development of adhesion, the average thickness is preferably 10 nm or more, more preferably 100 nm or more. From the viewpoint of reduction in connection resistance via a conductive adhesive layer, the thickness of the conductive adhesive layer is preferably 5 μm or less, more preferably 2 μm or less, further preferably 1 μm or less.

(Conductive Particles)

The conductive adhesive composition includes at least one kind of conductive particles, and the number average particle size of the conductive particles is from 1 nm to 3000 nm. There is no particular restriction on the conductive particles, insofar as the particles have conductivity. The conductive particles refer to particles composed of a material having a volume resistivity of $1 \times 10^{-7}$ Ω·m or less, or particles that form a conductor layer that has, after performing a reducing treatment under the conditions for a conductivity developing treatment as described below, a volume resistivity of $9 \times 10^{-7}$ Ω·m or less.

The conductive particles included in the conductive adhesive composition preferably include at least one selected from the group consisting of a transition metal and a transition metal oxide, and more preferably at least one selected from the group consisting of copper, copper oxide, cuprous oxide, gold, gold oxide, platinum, platinum oxide, silver, silver oxide, palladium, palladium oxide, rhodium, rhodium oxide, nickel and nickel oxide. When the conductive particles include at least one selected from the group consisting of a transition metal and a transition metal oxide, the content thereof in the conductive particles is preferably 70 mass-% or more, more preferably 90 mass-% or more.

The conductive particles are preferably transition metal particles, transition metal oxide particles, or core-shell particles having a core of a transition metal and a shell of a transition metal oxide, more preferably transition metal oxide particles or core-shell particles having a core of a transition metal and a shell of a transition metal oxide.

In a case in which conductive particles include a transition metal oxide, as described later, particles including a metallic transition metal are formed in a conductivity developing process for a conductive ink. In a case in which the conductivity developing treatment for the conductive ink is a "thermal treatment performed in the presence of a formic acid gas" or an "application treatment performed with a solution that contains an agent that allows an oxide to ionize or to form a complex and a reducing agent that reduces the metal ion or the metal complex to a metal (a reducing treatment solution)", the particles including a metallic transition metal serve as a precipitation starting point of a metal compact layer formed from the conductive ink. This enables bonding with at least a part of a conductor layer formed from the conductive ink. As a result, it tends to become more likely to achieve adhesion and conductivity of the substrate and the conductor layer more effectively.

Namely, the transition metal element included in the conductive particles in the conductive adhesive composition is preferably a transition metal element that is capable of serving as a precipitation starting point of a metal compact layer derived from the conductive ink. The conductive particles may include a transition metal oxide, because the metallic transition metal only needs to be formed by an initial stage of a conductivity developing treatment for a conductive ink as described above. In a method of producing a conductive substrate as described later, a conductivity developing treatment is performed for reducing a metallic oxide in a conductive ink. During this treatment, the transition metal oxide in the conductive particles is also reduced, thereby forming a metallic transition metal in the conductive particles.

Examples of the element of the transition metal used for the conductive particles in the conductive adhesive composition include copper, gold, platinum, silver, palladium, rhodium, and nickel. Examples of an oxide of these transition metals include palladium oxide, gold oxide, silver oxide, copper oxide, cuprous oxide, platinum oxide, rhodium oxide, and nickel oxide. In particular, the transition metal oxide is preferably selected from gold oxide, platinum oxide, rhodium oxide, silver oxide, palladium oxide, copper oxide and cuprous oxide, since these metal oxides are likely to reduce and readily form a metallic transition metal at an initial stage of the conductivity developing treatment for a conductive ink.

The number average particle size of the conductive particles is from 1 nm to 3000 nm. From the viewpoint of adhesion and conductivity of a conductive adhesive layer, the number average particle size is preferably from 10 nm to 2500 nm, more preferably from 50 nm to 2000 nm. From the viewpoint of achieving an even higher dispersibility, the number average particle size of the conductive particles is preferably 1000 nm or less, more preferably 500 nm or less, further preferably 100 nm or less. From a viewpoint of achieving an even higher conductivity, the number average particle size of the conductive particles is preferably 1 nm or more, more preferably 10 nm or more, further preferably 50 nm or more. The number average particle size of the conductive particles is measured with a transmission electron microscopy or a scanning electron microscope. For example, in the case of a scanning electron microscope, the number average particle size of the conductive particles can be obtained by observing the conductive particles at an acceleration voltage of 10 kV and a magnification at which the diameter of an average conductive particle corresponds to approximately 10% of the visual field, and calculating an arithmetic average value of the equivalent circle diameters of a hundred conductive particles that are randomly chosen from the conductive particles excluding those overlapping each other and not having a distinguishable profile. In a case in which it is not possible to choose a hundred particles at a single visual field, the measurement is carried out at plural visual fields.

The 90 volume-% average dispersed particle size of the conductive particles is preferably 2 μm (2000 nm) or less, more preferably 1 μm (1000 nm) or less, further preferably 0.6 μm (600 nm) or less. Although there is no particular restriction on the lower limit, it is preferably 1 nm or more, more preferably 10 nm or more, from the viewpoint of dispersibility. The 90 volume-% average dispersed particle size of the conductive particles can be obtained as a particle size at which the cumulative volume from the smaller particle size side of a particle size distribution of the dispersed conductive particles is 90%. The particle size distribution can be measured from a dispersion of the conductive particles with a laser scattering particle size distribution analyzer.

When the conductive adhesive composition is applied by an ink jet printing method or an ink jet coater method to form a conductive adhesive composition layer, the maximum dispersed particle size of the conductive particles is preferably 1 μm or less. There is no particular restriction on the lower limit and may be 1 nm or more, for example. The maximum dispersed particle size of the conductive particles is obtained from a dispersion of the conductive particles with a laser scattering particle size distribution analyzer.

An example of the measurement method with a laser scattering particle size distribution analyzer is shown below.

A laser scattering particle size distribution analyzer LS 13 320 (Beckman Coulter, Inc.) attached with a universal liquid module is left to stand for 30 minutes after turning on a main unit power source for stabilizing a light source, and a dispersing medium not including particles is charged in the liquid module with a "rinse" command of a measurement program. Then, measurement programs including "debubble", "measure offset", "align" and "measure background" are executed. Subsequently, a dispersion of the conductive particles that has been shaken to become uniform is added to the liquid module with a dropper until the indication for the sample amount turns from "Low" to "OK". Then, a particle size distribution is obtained by executing "measure" from the measurement programs. The settings for the laser scattering particle size distribution analyzer are Pump Speed: 70%, Include PIDS data: ON, Run Length: 90 seconds, dispersing medium refractive index: 1.332, respectively. A refractive index selected depending on the material of the conductive particles is used as the dispersed substance refractive index.

There is no particular restriction on the shape of the conductive particles, and examples include a nearly spherical shape, a flat shape, a blockish shape, a platy shape, a scaly shape, a long-granular shape, an acicular shape and a polyhedral shape. From the viewpoint of suitability for application or printing with respect to a substrate, the conductive particles preferably have a nearly spherical shape, a flat shape or a long-granular shape. The shape of the conductive particles can be determined with a transmission electron microscope or a scanning electron microscope. For example, in the case of a scanning electron microscope, the shape can be determined by observing the conductive particles at an acceleration voltage of 10 kV and a magnification at which the major diameter of an ordinary conductive particle corresponds to approximately from 20 to 40% of the visual field.

A conductive adhesive composition may include a single kind of conductive particles, or may include plural kinds of conductive particles. In addition to the conductive particles, the conductive adhesive composition may include a transition-metal compound that is capable of forming a solution.

There is no particular restriction on the content of the conductive particles in the conductive adhesive composition. From the viewpoint of conductivity in a direction of the film thickness after performing a conduction developing treatment, the content of the conductive particles is preferably 20 mass-% or more of the nonvolatile components in the conductive adhesive composition, more preferably 30 mass-% or more, further preferably 40 mass-% or more. From the viewpoint of adhesion, the content of the conductive particles is preferably 96 mass-% or less, more preferably 95 mass-% or less, further preferably 94 mass-% or less.

(Binder)

The conductive adhesive composition includes at least one kind of a binder. The binder serves to bond the conductive particles, which include a metallic transition metal that exists, or is formed, in a conductive adhesive layer, to a substrate by way of its chemical adhesion and an anchor effect. The binder is preferably an organic binder, an inorganic binder, or a combination thereof, from the viewpoint of chemical adhesion and toughness for developing a fixative anchor effect. The binder is more preferably a three-dimensionally cross-linkable organic binder, a three-dimensionally cross-linkable inorganic binder, or a combination thereof. The binder may be used singly, or in combination of two or more kinds.

Examples of the organic binder include an epoxy resin, a polyimide resin, a polyamide resin, a polyamide-imide resin, a phenolic resin, an isocyanate resin, a polyurea resin, an acrylic resin, a resol resin, a siloxane resin, a polyether resin, and precursor compounds of these resins. Among them, the organic binder is preferably at least one selected from the group consisting of an epoxy resin, a polyimide resin, a polyamide resin, a polyamide-imide resin, a phenolic resin, an isocyanate resin, an acrylic resin, a resol resin, a siloxane resin, and precursor compounds of these resins. The organic binder is more preferably at least one selected from the group consisting of an epoxy resin, a polyimide resin, an isocyanate resin, an acrylic resin, and precursor compounds of these resins.

The conductive adhesive composition may further include a curing agent, if necessary, in addition to the organic binder. The curing agent may be selected depending on the kind of the binder. For example, in a case in which the organic binder includes an epoxy resin, the curing agent may be selected from ordinarily used curing agents. Specific examples of the curing agent include a phenolic curing agent (preferably, a multifunctional phenol, a phenolic resin, and the like) and an amine curing agent. The content of the curing agent with respect to the binder may be selected depending on the curing agent. For example, the ratio may be from 0.8 to 1.2 on an equivalent basis.

The inorganic binder is preferably at least one selected from the group consisting of silicon oxide, titanium oxide, zircon oxide, tungsten oxide, zinc oxide, chromium oxide and precursor compounds of these oxides. A sol-gel condensation product may be used as an inorganic binder. Specific examples of the inorganic binder include an alkoxy silane condensate, a halogenated silane condensate, an organic aluminum condensate, an alkoxy titanium condensate, a halogenated titanium condensate, an alkoxy zircon condensate, a halogenated zircon condensate, a zircon salt of an organic acid, an indium salt of an organic acid, a gallium salt of an organic acid, a tin salt of an organic acid, a zinc salt of an organic acid, and tungsten oxide. Among them, an inorganic binder is preferably at least one selected from the group consisting of an alkoxy silane condensate, an organic aluminum condensate, an alkoxy titanium condensate, and an alkoxy zircon condensate.

When a sol-gel condensation product is used as the inorganic binder, an additive may be added in order to improve the stability of a precursor to be added in the conductive adhesive composition. Examples of the additive include triethanol amine, diethanol amine, and ethanol amine. The amount of the additive may be selected depending on the type or the purpose of the additive.

The binder preferably has a polar substituent in the molecule thereof, from the viewpoint of improving adhesion and affinity with respect to a metal. Examples of the polar substituent include a polyethylene glycol group, a polypropylene glycol group, a hydroxy group, a carbonyl group, an amino group, an imide group, an amide group, a thiol group, a disulfide group, an epoxy group, a thioepoxy group, an isocyanide, a cyano group, a thiocyanide group, a silanol group, a silazane group, a silanate group, a titanate group, and a phosphoric ester group. The binder preferably has at least one kind of polar substituent selected from the group consisting of the above-mentioned polar substituents.

The binder is preferably at least one selected from the group consisting of a precursor of the binder and a partly cross-linked oligomer. In a case in which the conductive adhesive composition includes a solvent, solubility and dispersibility with respect to a solvent is improved by using a precursor or an oligomer as the binder. When a precursor or an oligomer is used as the binder, a promoter for promoting a curing reaction may be included. By including a promoter, for example, progress of a three-dimensional cross-linking reaction becomes more efficient. As a promoter, an acid, a base, a metal catalyst, and the like are commonly used. The type of the promoter may be selected appropriately according to a binder type.

There is no particular restriction on the content of a binder in the conductive adhesive composition. From the viewpoint of adhesion, the content of the binder is preferably 4 mass-% or more of the nonvolatile components of the conductive adhesive composition, more preferably 5 mass-% or more, further preferably 6 mass-% or more. From the viewpoint of imparting conductivity, the content of the binder is preferably 80 mass-% or less, more preferably 70 mass-% or less, further preferably 60 mass-% or less.

There is no particular restriction on the content ratio of the conductive particles to the binder in the conductive adhesive composition. From the viewpoint of a balance between the adhesion and the conductivity in a film thickness direction, the ratio of the content of the binder to the content of the conductive particles (binder/conductive particles) is preferably from 0.04 to 4, more preferably from 0.06 to 1.5.

The conductive adhesive composition may further include a solvent, if necessary. A solvent that can dissolve a binder or a precursor of a binder is preferable. The solvent that can dissolve a binder or a precursor of a binder may be selected depending on the type of a binder. Specifically, in a case in which an organic binder is contained as a binder, examples of the solvent include a carbonate solvent such as propylene carbonate, an ester solvent such as γ-butyrolactone, a glycol ether solvent such as propylene glycol monobutyl ether, propylene glycol monomethyl ether acetate and tripropylene glycol, an alicyclic alcohol solvent such as terpineol and isobornyl cyclohexanol, and a ketone solvent such as methyl isobutyl ketone and methyl ethyl ketone. In a case in which a binder includes an inorganic binder, examples of the solvent include a water-soluble alcohol solvent such as isopropyl alcohol, ethanol, butanol, glycerine and diglycerine, and water.

When the conductive adhesive composition includes a solvent, the content of the solvent may be selected depending on the type of the solvent. In particular, the content of the solvent is preferably adjusted such that the content of nonvolatile components is from 5 mass-% to 70 mass-%, more preferably from 10 mass-% to 60 mass-%.

(Preparation of Conductive Adhesive Composition)

An example of a method for preparing a conductive adhesive composition is a method of mixing a binder and conductive particles having a number average particle size of from 1 nm to 3000 nm mixed with an optionally used solvent. The types and the contents of the respective components are as described above. When the particle size distribution of the conductive adhesive composition obtained as a dispersion by the mixing is greater than the above-mentioned range, a dispersing treatment may be performed. The maximum particle size of the dispersion may be adjusted by performing a classification treatment.

The dispersing treatment is performed with a commonly used disperser. Examples of the disperser include an ultrasonic disperser, a thin-layer shear disperser, a bead mill, a high-share mixer, a liquid-liquid collision disperser, a high-speed rotation disperser utilizing centrifugal field, a roll mill, and a colloid mill.

The classification treatment may be performed by a commonly used classification apparatus. Examples of the classification apparatus include a centrifugal separator, a filtration apparatus, a cylindrical centrifugal sedimentator, a decanter-type centrifugal sedimentator, a disk-type centrifugal sedimentator, and a sedimentation operation for coarse particles by still standing.

[Conductor Layer-Forming Composition]

The composition set according to the invention includes at least one conductor layer-forming composition (conductive ink). The conductive ink includes at least one kind of inorganic particles that include a metallic oxide, and a dispersing medium. The conductive ink may further include other components, if necessary. The conductive ink is preferably a liquid in which metallic nanoparticles mainly formed of a metallic oxide are dispersed in a dispersing medium, more preferably a liquid in which copper-based nanoparticles mainly formed of copper oxide are dispersed in a dispersing medium. As the liquid in which nanoparticles mainly formed of copper oxide are dispersed in a dispersing medium, for example, a liquid described in JP-A No. 2009-215501 may be used.

The inorganic particles including a metallic oxide that is included in the conductive ink may be either metallic oxide particles or core-shell particles having a core of a metal and a shell of a metallic oxide. Examples of the metal element that forms the metallic oxide include copper, silver, palladium, and nickel. Among them, the metal element that forms the metallic oxide is preferably at least one selected from the group consisting of copper and silver.

There is no particular restriction on the content of the metallic oxide included in the inorganic particles. Among them, the content of the metallic oxide in the inorganic particles is preferably 80 mass-% or more, more preferably 90 mass-% or more, further preferably 95 mass-% or more. It is thought, in the conductive ink according to the present embodiment, that a metallic oxide component diffuses as a metal formate or a metal ion during performing a conductivity developing treatment, and deposits on a metal of the conductive particles in the conductive adhesive layer, and as the result, a conductor layer formed from the conductive ink bonds with the conductive adhesive layer, thereby developing adhesion and conductivity. Accordingly, the content of the metallic oxide in the inorganic particles is preferably 80 mass-% or more.

There is no particular restriction on the shape of the inorganic particles, and may be a spherical shape, a lumpy shape, an acicular shape, a platy shape, a long-granular shape, an acicular shape, a polyhedral shape, and the like. From the viewpoint of dispersibility and viscosity characteristics, the inorganic particles preferably have a spherical shape, a lumpy shape, a long-granular shape, an acicular shape or a platy shape. The shape of the inorganic particles can be determined by observing with a transmission electron microscopy at an acceleration voltage of 10 kV and a magnification at which the major diameter of an ordinary inorganic particle corresponds to approximately from 20% to 40% of the visual field. There is no particular restriction on the diameter of the primary particles of the inorganic particles. From the viewpoint of dispersibility, the diameter of the primary particles of the inorganic particle is preferably from 1 nm to 1000 nm, more preferably from 1 nm to 500 nm, further preferably from 10 nm to 100 nm. The number average particle size of the primary particles of the inorganic particles may be measured with a transmission electron microscope or with a scanning electron microscope. For example, in the case of a scanning electron microscope, the number average particle size of the inorganic particles can be obtained by observing the inorganic particles at an acceleration voltage of 10 kV and a magnification at which the diameter of an average inorganic particle corresponds to approximately from 20% to 40% of the visual field, and calculating an arithmetic average value of the equivalent circle diameters of a hundred inorganic particles that are randomly chosen from the inorganic particles excluding those overlapping each other and not having a distinguishable profile. In a case in which it is not possible to choose a hundred particles at a single visual field, the measurement is carried out at plural visual fields.

(Copper-Based Nanoparticles)

Copper-based nanoparticles are preferably at least one selected from the group consisting of copper oxide particles and particles having a core-shell structure with a copper core and a copper oxide shell (hereinafter, also referred to as "copper/copper oxide core-shell particles"). Either one of the copper oxide particles or the copper/copper oxide core-shell particles may be used, or both may be used in combination.

—Copper Oxide Particles—

Examples of the copper oxide particles include particles that include, as a main component, copper (I) oxide, copper (II) oxide, or a mixture thereof. There is no particular restriction on the content of copper oxide in the copper oxide particles. For example, it is preferably 80 mass-% or more, more preferably 90 mass-% or more, further preferably 95 mass-% or more. The copper oxide particles may have, for example, a spherical shape, a lumpy shape, an acicular shape, or a platy shape. The copper oxide particles may be selected from commercially available products, such as copper oxide nanoparticles produced by a vapor deposition method from CIK Nanotek Corporation, copper oxide nanoparticles synthesized by a plasma flame method from Nisshin Engineering Inc., platy copper oxide particles from Chemirite, Ltd., and copper oxide nanoparticles synthesized by a pulsed wire discharge method from Palmeso Co., Ltd.

The primary particle diameter of the copper oxide particles is preferably from 1 nm to 1000 nm, more preferably from 1 nm to 500 nm, further preferably from 10 nm to 100 nm.

—Copper/Copper Oxide Core-Shell Particles—

The copper/copper oxide core-shell particles are inorganic particles having a core of metallic copper that is coated with copper (I) oxide, copper (II) oxide or a mixture thereof. The copper/copper oxide core-shell particles may have, for example, a spherical shape, a lumpy shape, an acicular shape, or a platy shape. The copper/copper oxide core-shell particles may be selected from commercially available products, such as copper nanoparticles that are synthesized by a plasma flame method and have a naturally oxidized surface, from Nisshin Engineering Inc., and copper nanoparticles that have a forcibly oxidized surface, from TEKNA Plasma Systems Inc. (Canada).

From the viewpoint of improving adhesion and conductivity of a conductor layer, the content of copper oxide in the copper/copper oxide core-shell particles is preferably 80 mass-% or more, more preferably 90 mass-% or more, further preferably 95 mass-% or more, in the total amount of copper oxide and metallic copper. It is thought, in a conductive ink according to the present embodiment, that a copper oxide component diffuses as copper (I) formate or a copper ion during performing a conductivity developing treatment and deposits on a metal of the conductive particles in the conductive adhesive layer, and as the result, a conductor layer formed from the conductive ink bonds with the conductive adhesive layer, thereby developing more improved adhesion and conductivity.

The copper/copper oxide core-shell particles preferably have a primary particle size of from 1 nm to 1000 nm, more preferably from 1 nm to 500 nm, further preferably from 10 nm to 100 nm.

There is no particular restriction on the content of the inorganic particles that includes metallic oxide in the conductive ink. From the viewpoint of adhesion and conductivity of a conductor layer to be formed, the content of the inorganic particles is preferably 15 mass-% or more, more preferably 20 mass-% or more, with respect to the total mass of the conductive ink.

(Dispersing Medium)

Examples of the dispersing medium included in the conductive ink include organic solvents such as γ-butyrolactone, N-methylpyrrolidone, propylene carbonate, ethylene glycol sulfite, acetonitrile, sulfolane and terpineol. Among them, at least one selected from the group consisting of γ-butyrolactone, propylene carbonate, ethylene glycol sulfite, sulfolane and terpineol is preferred. The dispersing medium may include a single kind of organic solvent, or may include two or more kinds of organic solvents. There is no particular restriction on the content of the dispersing medium. From the viewpoint of viscosity characteristic, and from the viewpoint of adhesion and conductivity of a conductor layer to be formed, the content of the dispersing medium is preferably 90 mass-% or less, more preferably 80 mass-% or less, with respect to the total mass of the conductive ink.

The conductive ink may include other components, in addition to a dispersing medium and inorganic particles containing a metallic oxide. Examples of such components include a surface tension adjuster, a thixotropy imparting agent, a thickener, and a reducing agent. In the conductive ink, the content of an ionic component, such as a chloride ion, a sodium ion or a nitrate ion, and water is preferably 10,000 mass-ppm or less, more preferably 2,600 mass-ppm or less. When the content of an ionic component and water is 10,000 mass-ppm or less, coagulation or precipitation of a component in the conductive ink can be suppressed.

The composition set may constitute a composition kit by including other components in addition to the conductor layer-forming composition and the conductive adhesive composition. Examples of the other components include an instruction manual describing a method for forming a conductor layer on a substrate having a conductive film with a conductor layer-forming composition and a conductive adhesive composition, a material safety data sheet, a certificate of analysis, a reagent for a conductivity developing treatment of a conductive ink, an anti-rust treatment agent for a conductor layer, an insulating ink, a cleaning solvent, and a hydrophilic/hydrophobic treatment agent.

<Conductive Substrate>

The conductive substrate according to the invention includes a substrate having a conductive film; a conductive adhesive layer provided on the conductive film, the conductive adhesive layer being a cured product of a conductive adhesive composition comprising a binder and conductive particles having a number average particle size of from 1 nm to 3000 nm; and a conductor layer provided on the conductive adhesive layer, the conductor layer comprising a metal that is a reduced product of a conductor layer-forming composition comprising a dispersing medium and inorganic particles comprising a metallic oxide. The conductive substrate may include, if necessary, other components.

(Substrate Having Conductive Film)

In the conductive substrate, a substrate having a conductive film is used from the viewpoint of developing a function of a conductive adhesive layer to establish a conduction between a conductor layer formed from a conductive ink and a substrate. The substrate having a conductive film may be a substrate of an electric conductor whose entire body is conductive, or a substrate formed of an insulating substrate and a conductive film formed on at least one surface of the insulating substrate.

Examples of a metal or a metallic compound that forms a conductive film of a substrate having a conductive film include aluminum, copper, silver, gold, platinum, nickel, tin, lead, palladium, indium tin oxide (ITO), indium zinc oxide (IZO), zinc tin oxide (ZTO), fluorine-doped tin oxide (FTO), $InO_2$, $SnO_2$, and ZnO. The conductive film preferably includes at least one selected from the group consisting of the metals and metallic compounds as mentioned above, more preferably at least one selected from the group consisting of aluminum, ITO, copper and gold.

In a case of a substrate having an insulating substrate and a conductive film formed on at least one surface of the insulating substrate, there is no particular restriction on the shape of the conductive film, insofar as the conductive film is provided on the insulating substrate. The conductive film may be provided on the entire surface of the insulating substrate, or may be provided only on a part of the insulating substrate surface. In a case in which the conductive film is provided on a part of the insulating substrate surface, there is no particular restriction on the shape of the region at which the conductive film is to be provided, and may be selected depending on the purposes and the like. There is no particular restriction on the thickness of the conductive film, and the thickness may be selected depending on the purposes. For example, the thickness of the conductive film is preferably from 10 nm to 100,000 nm, more preferably from 50 nm to 50,000 nm. The thickness of the conductive film is measured with a three-dimensional non-contact profilometer, a stylus profilometer, or an X-ray tomography.

Examples of the insulating substrate include a film, a sheet, and a plate formed from an epoxy resin, a polyimide resin, a silicone resin, a polyamide-imide resin, a polyamide resin, a polyethylene naphthalate resin, a polyether sulfone resin, a polyethylene resin, a terephthalate resin, a polyether ether ketone resin, a polycarbonate resin, a liquid crystal polymer resin, a cyanate ester resin, a fiber reinforced resin, a polyolefin resin, a polyphenylene sulfide resin, glass, a thermally oxidized film, silicon nitride, boron nitride, and silicon carbide. There is no particular restriction on the size and the thickness of the insulating substrate, and it may be selected appropriately depending on the purposes and the like. For example, the thickness of the insulating substrate is preferably from 1 μm to 5000 μm, more preferably from 10 μm to 1000 μm. The thickness of the insulating substrate is measured with a caliper, a digital linear gauge, an ultrasonic microscope, or an X-ray tomography.

On the conductive film of the substrate having a conductive film, a conductive adhesive layer, which is a cured product of a conductive adhesive composition that includes a binder and conductive particles having a number average particle size of from 1 nm to 3000 nm, is provided. On the conductive adhesive layer, a conductor layer that includes a metal, which is a reduced product of a conductor layer-forming composition that includes a dispersing medium and inorganic particles including a metallic oxide, is provided. Since the conductive adhesive layer includes a binder and conductive particles having a number average particle size within a specific range, and the conductor layer includes a metal, which is a reduced product of the inorganic particles, it is possible to achieve excellent adhesion and conductivity between the conductive film and the conductor layer provided on the conductive adhesive layer.

In the conductive substrate, the conductive adhesive layer may be provided at a region on the insulating substrate other than the conductive film, in addition to a region on the conductive film. In this case, since the insulating substrate itself does not have conductivity, the conductive adhesive layer provided on the insulating substrate functions solely as an adhesive layer between the conductor layer and the insulating substrate.

There is no particular restriction on the average thickness of the conductive adhesive layer. From the viewpoint of adhesion, the average thickness of the conductive adhesive layer is preferably 10 nm or more, more preferably 100 nm or more. From the viewpoint of conductivity, the average thickness of the conductive adhesive layer is preferably 5 μm or less, more preferably 2 μm or less, further preferably 1 μm or less. From the viewpoint of conductivity and adhesion, the average thickness of the conductive adhesive layer is preferably from 10 nm to 2000 nm, more preferably from 50 nm to 1500 nm, further preferably from 100 nm to 1000 nm. The average thickness of the conductive adhesive layer can be determined as an arithmetic mean value, which is obtained by measuring the depth of a groove formed by removing only the conductive adhesive with an ellipsometer, a cutter knife or the like, at 10 points selected arbitrarily with a three-dimensional non-contact profilometer, a stylus profilometer, or an atomic force microscope (AFM).

The conductor layer includes a metal, which is a reduced product of inorganic particles containing a metallic oxide. From the viewpoint of conductivity and adhesion, the conductor layer preferably includes metallic copper. There is no particular restriction on the volume resistivity of the conductor layer. The volume resistivity of the conductor layer is preferably from $1.5 \times 10^{-8}$ Ω·m to $1.0 \times 10^{-7}$ Ω·m, more preferably from $1.5 \times 10^{-8}$ Ω·m to $8 \times 10^{-8}$ Ω·m.

From the viewpoint of conductivity and adhesion, at least a part of the metal in the conductor layer is preferably bonded with at least some of conductive particles in the conductive adhesive layer by metal bonding. More preferably, the conductor layer has a volume resistivity of from $1.5 \times 10^{-8}$ Ω·m to $1.0 \times 10^{-7}$ Ω·m and at least a part of the metal in the conductor layer is bonded with at least some of conductive particles in the conductive adhesive layer by metal bonding.

There is no particular restriction on the average thickness of the conductor layer provided on the conductive adhesive layer. From the viewpoint of conductivity, the average thickness of the conductor layer is preferably 100 nm or more, more preferably from 100 nm to 100,000 nm, further preferably from 50 nm to 50,000 nm. The average thickness of the conductor layer is determined as an arithmetic mean value, which is obtained by measuring the layer thickness at 10 points selected arbitrarily with a three-dimensional non-contact profilometer, a stylus profilometer, or an X-ray tomography.

Figure 2:
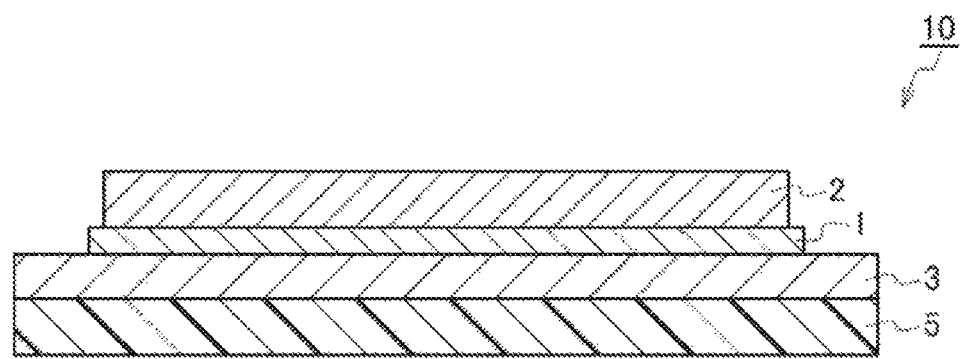
FIG. 2 is a cross-sectional view showing schematically an example of a conductive substrate according to the present embodiment.

Next, an example of the structure of the conductive substrate according to the current embodiment will be described by referring to the drawings. FIG. 1 is a perspective view showing schematically an example of a structure of a conductive substrate 10 according to the current embodiment, and FIG. 2 is an outline cross-sectional view of the same. In FIG. 1 and FIG. 2, a conductive film 3 is provided over the entire area of one surface of an insulator substrate 5. On a part of a region on a surface of the conductive film 3 opposite to the surface facing the insulator substrate 5, a conductive adhesive layer 1, which is a cured product of the conductive adhesive composition, is provided. On a part of a region of a surface of the conductive adhesive layer 1 opposite to the surface facing the conductive film 3, a conductor layer 2 formed from the conductor layer-forming composition is provided. The conductor layer 2 is bonded to the conductive film 3 by the conductive adhesive layer 1, and is electrically in contact with the conductive film 3. In the conductive substrate 10, in which a conductor layer 2, a conductive adhesive layer 1 and a conductive film 3 are layered in this order, the conductor layer 2 exhibits excellent adhesion and conductivity with respect to the conductive film 3.

Figure 3:
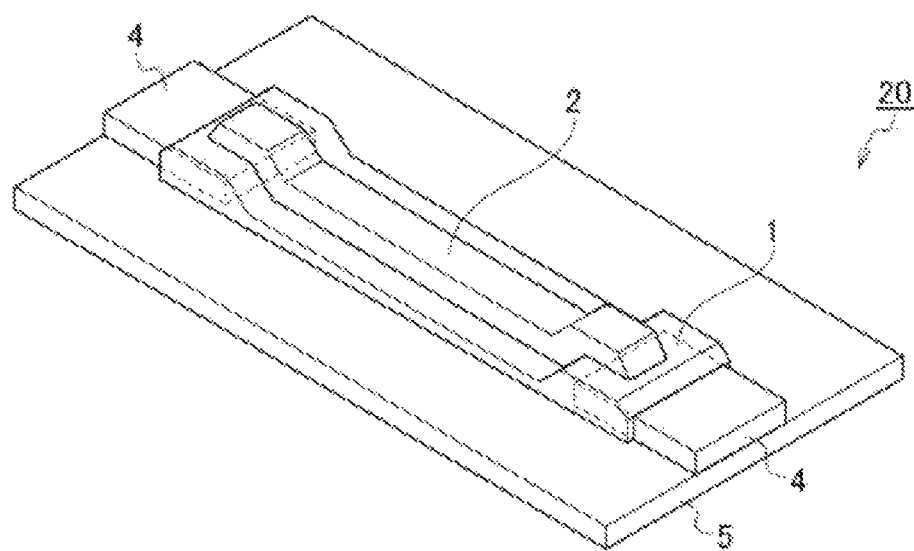
FIG. 3 is a perspective view showing schematically another example of a conductive substrate according to the present embodiment.
Figure 4:
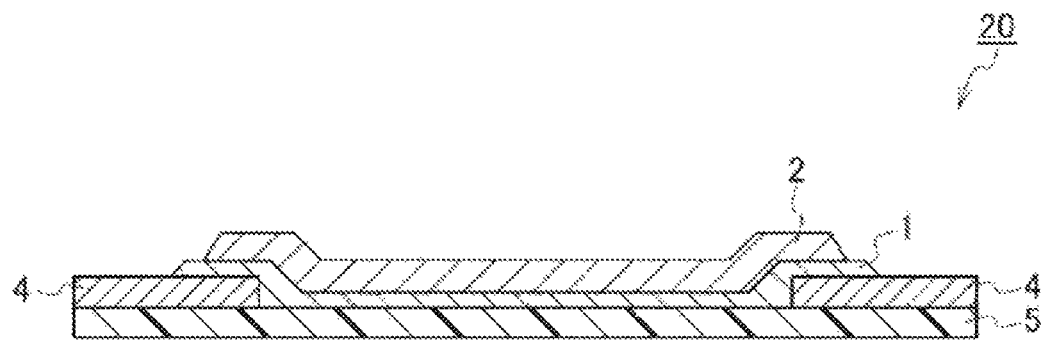
FIG. 4 is a cross-sectional view showing schematically another example of a conductive substrate according to the present embodiment.

FIG. 3 is a perspective view showing schematically an example of a structure of a conductive substrate 20 according to the current embodiment, and FIG. 4 is an outline cross-sectional view of the same. In FIG. 3 and FIG. 4, conductive films 4 are provided on two regions of a surface of an insulator substrate 5. On a part of a surface of the conductive films 4 opposite to the surface facing the insulator substrate 5 and a part of a surface of the insulator substrate 5, a conductive adhesive layer 1, which is a cured product of the conductive adhesive composition, is provided so as to connect the two conductive films 4. Further, on a part of a surface of the conductive adhesive layer 1 opposite to the surface facing the conductive films 4 and the insulator substrate 5, a conductor layer 2 formed from the conductor layer-forming composition is provided. The conductor layer 2 is bonded to the conductive films 4 by the conductive adhesive layer 1 and the insulator substrate 5, and is in electrical contact with the conductive films 4. In the conductive substrate 20, in which the conductor layer 2 is provided so as to connect the two conductive films 4 by the conductive adhesive layer 1, the conductor layer 2 exhibits excellent adhesion and conductivity with respect to the conductive films 4, and electrically connects the conductive films 4 provided at two regions. Although FIG. 3 illustrates an embodiment in which the conductive adhesive layer 1 is provided also at side surfaces of the conductive films 4, it is also possible not to provide the conductive adhesive layer 1 at side surfaces of the conductive films 4.

<Method of Producing Conductive Substrate>

The method of producing a conductive substrate according to the invention includes a process of forming a conductive adhesive composition layer by applying, onto a substrate having a conductive film, a conductive adhesive composition comprising a binder and conductive particles having a number average particle size of from 1 nm to 3000 nm; a process of forming a conductive adhesive layer by curing the binder in the conductive adhesive composition layer; a process of forming a conductor layer-forming composition layer by applying, onto the conductive adhesive layer, a conductor layer-forming composition comprising a dispersing medium and inorganic particles comprising a metallic oxide; and a process of forming a conductor layer comprising a metal by reducing the metallic oxide in the conductor layer-forming composition layer. The method may further include, if necessary, other processes.

In the process of forming a conductive adhesive composition layer, a conductive adhesive composition that includes a binder and conductive particles having a number average particle size of from 1 nm to 3000 nm is applied onto a substrate having a conductive film. The particulars of the substrate having a conductive film and the conductive adhesive composition are as described above. Examples of the method for applying a conductive adhesive composition onto a substrate include a coating method and a printing method. The coating method and a printing method may be selected from ordinarily used methods. By selecting a coating method or a printing method, a conductive adhesive composition layer of a desired shape can be formed on a substrate. In particular, in a case of forming a conductive adhesive composition layer on the substrate in a desired pattern, a printing method is suitably used.

Specific examples of the coating method include a bar coater method, a comma coater method, a die coater method, a slit coater method, a gravure coater method, and an ink jet coater method. Examples of the printing method include a screen printing method, a jet printing method, an ink jet printing method, a transfer printing method, an offset printing method, a dispenser method, and a needle dispenser method.

There is no particular restriction on the thickness of a conductive adhesive composition layer, and it may be selected such that the average thickness of the conductive adhesive layer is within a desired range. For example, from the viewpoint of adhesion of the conductive adhesive layer, the thickness of the conductive adhesive composition layer is preferably adjusted such that the average thickness of a conductive adhesive layer is 10 nm or more, more preferably 100 nm or more. From the viewpoint of conductivity of the conductive adhesive layer, the thickness of the conductive adhesive composition layer is preferably adjusted such that the average thickness of the conductive adhesive layer is 5 μm or less, more preferably 2 μm or less, further preferably 1 μm or less.

The conductive adhesive composition layer formed on the substrate is preferably subjected to a drying treatment, as necessary. By performing a drying treatment, flowage of the conductive adhesive composition layer can be suppressed and a desired shape may be readily maintained. In addition, subsequent processes may be readily performed. There is no particular restriction on the method for a drying treatment, and it may be selected from ordinary methods. Examples of the drying treatment include standing at normal temperature, drying by heating, and drying in vacuum. Examples of the apparatus used for drying by heating or drying in vacuum include a hot plate, a warm-air drier, a warm-air furnace, a nitrogen drier, an infrared drier, an infrared furnace, a far-infrared furnace, a microwave heater, a laser heater, an electromagnetic heater, a heater heating apparatus, a steam furnace, and a hot plate press.

In a case of performing the drying treatment by heating, the heating temperature is preferably from 50° C. to 180° C., more preferably from 60° C. to 150° C., for example. The drying time is selected depending on the heating temperature or the composition of a conductive adhesive composition. It is preferably from 1 min to 120 min, more preferably from 5 min to 60 min, for example.

In a process of forming a conductive adhesive layer, a binder included in the conductive adhesive composition layer is cured. By curing the binder, adhesion between the substrate and the conductor layer is improved due to the original adhesive property of the binder, and also the mechanical strength of the conductive adhesive layer itself can be improved. The curing treatment for a binder may be a treatment for semi-curing a binder. The method for curing a binder may be selected appropriately depending on the type of the binder or the like. The method for curing a binder is preferably a thermally-curing treatment.

The heating temperature for the thermally-curing treatment may be selected depending on the type of the binder or the like. The heating temperature for a thermally-curing treatment is preferably from 100° C. to 250° C., more preferably from 150° C. to 200° C. The heating time depends on the heating temperature or the like. For example, when the heating temperature is 175° C., the heating time is preferably from 5 min to 60 min, more preferably from 10 min to 30 min.

The heating may be performed by using a hot plate, a warm-air drier, a warm-air furnace, a nitrogen drier, an infrared drier, an infrared furnace, a far-infrared furnace, a microwave heater, a laser heater, an electromagnetic heater, a heater heating apparatus, a steam furnace, a hot plate press, or the like. The thermally-curing treatment is performed after the formation of a conductive adhesive composition layer, but it may be performed after performing a conductivity developing treatment as described later.

In the process of forming a conductor layer-forming composition layer, a conductor layer-forming composition that includes a dispersing medium and inorganic particles including a metallic oxide (conductive ink) is applied onto a conductive adhesive layer. The particulars of the conductor layer-forming composition are as described above. Application of the conductor layer-forming composition onto a conductive adhesive layer may be performed by a coating method or a printing method. Examples of the coating method include a bar coater method, a comma coater method, a die coater method, a slit coater method, a gravure coater method, and an ink jet coater method.

There is no particular restriction on the thickness of the conductor layer-forming composition layer formed on the conductive adhesive layer. From the viewpoint of conductivity, the thickness of the conductor layer-forming composition layer is preferably determined such that the average thickness of the conductor layer formed from the conductor layer-forming composition layer is 100 nm or more, preferably from 0.1 μm to 100 μm, more preferably 0.1 μm to 50 μm, further preferably from 0.1 μm to 15 μm.

There is no particular restriction on the shape of the conductor layer-forming composition layer, and it may be selected depending on the purposes such that a conductor layer having a desired shape can be formed. For example, the conductor layer-forming composition layer may be formed on the entire surface of the conductive adhesive layer, or may be formed only on a portion of the conductive adhesive layer in a patterned manner.

The conductor layer-forming composition applied onto the conductive adhesive layer includes a dispersing medium. It is preferable to perform a drying treatment in order to remove at least a part of a dispersing medium prior to performing a conductivity developing treatment as described later. The drying treatment may be selected performed by known methods. The conditions for the drying treatment may be selected depending on the type or the content of a dispersing medium, the thickness of the conductor layer-forming composition layer, and the like. The drying treatment may be performed, for example, by heating. When the drying treatment is performed by heating, the heating temperature may be from 50° C. to 180° C., preferably from 80° C. to 150° C. The drying time may be from 5 min to 30 min. The apparatus used for drying by heating are as described above. Since the conductor layer-forming composition includes inorganic particles including a metallic oxide (preferably, copper/copper oxide core-shell particles and copper oxide particles), it is not necessary to perform the drying in an atmosphere from which oxygen is eliminated, unlike the case of using a conductive ink containing metal articles such as metallic copper particles as inorganic particles.

In the process of forming a conductor layer, a metallic oxide in the conductor layer-forming composition layer is reduced to form a conductor layer containing a metal. By performing a conductivity developing treatment for reducing a metallic oxide, a conductor layer that exhibits excellent adhesion and conductivity with respect to a substrate can be formed. In particular, in a case in which a conductive adhesive layer, which is disposed between a conductor layer-forming composition layer and a conductive film of a substrate, contains a transition metal oxide, the transition metal oxide in the conductive adhesive layer is also reduced by a conductivity developing treatment. As a result, a transition metal, which serves as a precipitation starting point for a reduced product of a metallic oxide in a conductor layer-forming composition layer, is formed in a conductive adhesive layer, thereby forming a conductor layer that exhibits improved adhesion and conductivity with respect to a substrate. Examples of the conductivity developing treatment include a heat treatment in the presence of a formic acid gas, and an application treatment with a reducing treatment liquid, as described below.

(Heat Treatment in the Presence of Formic Acid Gas)

In the heat treatment that is performed in the presence of a formic acid gas (hereinafter, also referred to as a "formic acid gas treatment") for developing the conductivity of a conductor layer-forming composition layer in a layered structure of a substrate, a conductive adhesive layer, and a conductor layer-forming composition layer as previously mentioned, a metallic oxide is reduced to form a metal by performing a heat treatment in a gas atmosphere including a formic acid gas as an essential component, thereby turning the conductor layer-forming composition layer into a conductor. The details of a formic acid gas treatment may be referred to, for example, International Publication No. WO 2011/034016.

The gas atmosphere including formic acid is preferably prepared by a method in which a carrier gas is saturated with formic acid by contacting the carrier gas with a liquid formic acid by bubbling or the like, and then the saturated gas is introduced to an object to be treated, or a method in which formic acid is gasified by elevating the temperature to at least 100° C., which is the boiling point of formic acid, or reducing the pressure, and then the gas is introduced to an object to be treated. In a gas atmosphere containing a formic acid gas, it is preferable to avoid contact of the liquid formic acid to an object to be treated. In a case in which the liquid formic acid contacts an object to be treated, the temperature of the object becomes 100° C. or lower and progress of the conductivity development is inhibited. In addition, for example, a part of a metallic oxide (preferably copper oxide) may dissolve in formic acid and cause a loss of the conductor layer-forming composition layer or deposit of a metal (preferably copper) outside the region at which the conductor layer-forming composition has been applied.

The carrier gas is preferably a gas that is less reactive with a formic acid gas. In particular, a combination of formic acid gas and oxygen may cause ignition or explosion. Therefore, when the carrier gas includes oxygen, the ratio of oxygen to formic acid gas is preferably outside the explosive range. The ratio outside the explosive range is 18 volume-% or less, or 51 volume-% or more, in a case of mixing formic acid with air.

The treatment temperature is preferably not less than 120° C., which is a temperature at which a metal precipitates from a metallic oxide by the formic acid gas treatment. For the viewpoint of reaction rate, the treatment temperature is more preferably not less than 140° C. The upper limit of the treatment temperature depends on, for example, the heat-resistant temperature of a substrate. There is no particular restriction on the treatment pressure, and it may be under any of conditions of atmospheric pressure, reduced pressure, or increased pressure. The treatment time is preferably, for example, from 1 to 120, more preferably from 5 to 60.

In a case in which a formic acid gas treatment is used in a process of forming a conductor layer, a process of removing formic acid may be provided after the formic acid gas treatment. By providing the formic acid removing process, corrosion of a metal (copper), which may generate when formic acid used in the treatment remains on a surface of a metal (preferably copper) formed by reduction, can be suppressed. Examples of the method for removing formic acid include a heat treatment performed in an oxygen-free gas flow, a heat treatment performed under a reduced pressure, and a washing treatment with water. The heat treatment performed in an oxygen-free gas flow may be a heat treatment performed in a formic acid gas treatment vessel while supplying an oxygen-free gas not including formic acid, or a heat treatment performed with a heat source in an oxygen-free gas oven and in an oxygen-free gas flow. The heat treatment performed under a reduced pressure may be, in a case in which the formic acid gas treatment is performed in a reduced pressure vessel, a heat treatment performed under a reduced pressure after terminating the supply of formic acid, or a heat treatment performed in reduced pressure oven.

(Application Treatment of Reducing Treatment Liquid)

In the application treatment of a reducing treatment liquid (hereinafter, also referred to as a "reducing liquid treatment") for developing conductivity of a conductor layer-forming composition layer in the previously described layered structure including a substrate, a conductive adhesive layer, and a conductor layer-forming composition layer, a conductivity developing treatment is performed by applying a reducing treatment liquid to the layered structure and reducing a metallic oxide to form a metal. The details of the reducing liquid treatment may be referred to, for example, International Publication No. WO 2009/078448.

The reducing treatment liquid is a solution including an agent for causing elution of a metallic oxide (preferably copper oxide) component as a metal ion (preferably copper ion) or a metal complex (preferably copper complex), a reducing agent for reducing the eluted metal ion or metal complex and allowing the same to deposit on a metal, and a solvent for dissolving these components, as essential components. The reducing treatment liquid does not include a metal ion. Details of the components are described below.

There is no particular restriction on the agent, insofar as it can dissolve a metallic oxide (preferably copper oxide) by way of ionization or complexation. The agent is preferably at least one selected from the group consisting of a basic nitrogen-containing compound (such as an amine compound or ammonia), a salt of a basic nitrogen-containing compound, an inorganic acid, an inorganic acid salt, an organic acid, an organic acid salt, a Lewis acid, dioxime, dithizone, hydroxyquinoline, EDTA and β-diketone. Among these, the agent is preferably at least one selected from basic nitrogen-containing compounds, since these compounds become active on the basic side. The agent is more preferably at least one selected from the group consisting of an amine compound and ammonia. The agent is further preferably at least one selected from the group consisting of a primary amine compound and ammonia, since a metallic oxide is well dissolved with these compounds.

Other preferable examples of the basic nitrogen-containing compound include a tertiary amine compound, such as a salt of ethylenediaminetetraacetic acid, triethanol amine, and triisopanol amine. Examples of the organic acid and the organic acid salt include a carboxylic acid and a carboxylate. Among them, the organic acid or the organic acid salt is preferably at least one selected from the group consisting of a multivalent carboxylic acid, a multivalent carboxylate, an aromatic carboxylic acid, an aromatic carboxylate, a hydroxycarboxylic acid, and a hydroxycarboxylate. Specifically, the organic acid or the organic acid salt is preferably at least one selected from the group consisting of tartaric acid, phthalic acid, maleic acid, succinic acid, fumaric acid, salicylic acid, malic acid, citric acid, and salts of these compounds.

Examples of the dioxime include dimethyl glyoxime, benzil diglyoxime, and 1,2-cyclohexanedione diglyoxime. Examples of the β-diketone include acetylacetone. Examples of the aminoacetic acid include an amino acid such as glycine.

The concentration of the agent for causing ionization or complexation of a metallic oxide in the reducing treatment liquid is preferably from 0.001 mol/L to 30 mol/L, more preferably from 0.01 mol/L to 15 mol/L, further preferably from 0.1 mol/L to 8 mol/L. When the concentration of the agent is 0.001 mol/L or more, a metallic oxide tends to dissolve at a sufficient rate.

As the reducing agent, at least one selected from the group consisting of a boron hydride compound, an aluminum hydride compound, an alkylamine borane, a hydrazine compound, an aldehyde compound, a phosphorous compound, a hypophosphorous compound, ascorbic acid, adipic acid, formic acid, an alcohol, a tin (II) compound, metallic tin, cobalt (II) acetate and a hydroxyamine, may be favorably used. Among these, at least one selected from the group consisting of dimethylamine borane (DMAB), hydrazine, formaldehyde, ascorbic acid, and cobalt (II) acetate is favorably used. Further, citric acid or the like may also be favorably used.

The concentration of the reducing agent in the reducing treatment liquid is preferably from 0.001 mol/L to 30 mol/L, more preferably from 0.01 mol/L to 15 mol/L, further preferably from 0.01 mol/L to 10 mol/L. When the concentration of the reducing agent is 0.001 mol/L or more, formation of a metal tends to progress at a sufficient rate.

The molar ratio of the content of the agent for causing ionization or complexation of a metallic oxide to the content of the reducing agent (i.e., agent/reducing agent) is preferably less than 5,000. When the molar ratio is less than 5,000, the concentration of the metal ion released into the solution tends to be not too high, and deposition of a metal at a position outside the conductor layer-forming composition layer is suppressed.

From the viewpoint of dissolving the agent (solubilizer), the reducing agent, and the metal ion or the metal complex, the solvent is preferably a high polarity solvent. Specific examples of the high polarity solvent include water, glycerine and formamide.

Although the reduction reaction of a metallic oxide in the reducing treatment liquid usually proceeds at room temperature (from 15 to 30° C.), the reducing treatment liquid may be heated or cooled depending on the needs for acceleration or deceleration of the reaction, modification of the nature of a formed metal film (conductor layer), and the like. It is also possible to perform addition of an additive, stirring, vibration of a substrate, or application of ultrasonic waves, for the purpose of controlling homogeneity of a metal film, a reaction rate, foaming during reaction, and the like.

The conductivity developing treatment is performed by applying a reducing treatment liquid to the conductor layer-forming composition layer formed as previously mentioned. Specific examples of the method for application include a method of dipping a substrate having a conductor layer-forming composition layer formed thereon in a reducing treatment liquid in a container, and a method of spraying a reducing treatment liquid to the conductor layer-forming composition layer in a continuous manner. In either method, a metallic oxide in the conductor layer-forming composition layer is ionized or complexed by an agent in a treatment liquid, and then reduced to a metal by a reducing agent. As a result, gaps among the inorganic particles can be filled with a metal, and a compact conductor layer is formed.

The treatment time with a reducing treatment liquid may be set depending on the concentration of a treatment liquid, temperature or the like. For example, the treatment time may be from 0.5 hours to 6 hours, and the temperature may be from room temperature to 90° C.

A conductive substrate, on which a conductor layer has been formed by the reducing treatment, is preferably exposed to ultrapure water or the like and dried by air blowing, a hot plate, warm-air blowing, an oven, or the like. In order to facilitate drying, a solvent such as acetone, methanol or ethanol, may be applied to replace water with the solvent, prior to performing the drying.

By performing the method of producing the conductive substrate according to the invention as described above, a conductive substrate that exhibits excellent adhesion between the conductor layer and the substrate and has a conductor pattern that electrically connects the conductor layer and the conductive film of the substrate can be produced.

(Method of Producing Wiring Substrate)

By performing a treatment to a substrate having a conductive film with the conductive adhesive composition, and then forming a wiring pattern by applying a conductor layer-forming composition (conductive ink) in a desired shape and performing a conductivity developing treatment, a wiring substrate that exhibits excellent adhesion between the wiring and the substrate, conduction between the wiring and the substrate, and a high conductivity can be obtained. In the following, the method of producing the wiring substrate is explained. Since the method is different from the method of producing the conductive substrate as previously described only in terms of the conductor layer and the wiring pattern, only the method for forming a wiring pattern is explained.

(Formation of Wiring Pattern)

As the method for forming a wiring pattern in a desired manner with a conductive ink on the conductive adhesive layer formed on the substrate, a printing method and a coating method, which are conventional methods for applying ink, may be used. For the formation of a pattern with a conductive ink, a screen printing method, a jet printing method, an ink jet printing method, a transfer printing method, an offset printing method, and a dispenser method may be applied.

After the formation of a pattern with a conductive ink, the pattern formed of the conductive ink is subjected to a conductivity developing treatment in a similar manner to the method of producing a conductive substrate, whereby a metallic oxide in the pattern is reduced to a metal and a wiring substrate is produced.

The process subsequent to the formation of a pattern with a conductive ink is substantially the same as the process of the method of producing a conductive substrate. Thus, a conductor layer formed from a conductive ink can be produced.

EXAMPLES

The present invention will be described more specifically by way of Examples. However, the present invention is not limited to the Examples.

Example 1

Preparation of Conductive Adhesive Composition

As conductive particles, 11.75 g of copper/copper oxide core-shell nanoparticles (average particle diameter: 70 nm, Nisshin Engineering Inc.) were mixed with a solution prepared by dissolving, as a binder, 0.65 g of dipropylene glycol diglycidyl ether (DER RESIN GR. 736, Polysciences, Inc.), 0.65 g of bisphenol A novolac epoxy resin (N865, DIC Corporation) and 0.74 g of bisphenol A novolac (VH-4170, DIC Corporation) in 32 g of propylene carbonate (Wako Pure Chemical Industries, Ltd.). The mixture was dispersed with an ultrasonic homogenizer (US-600, Nippon Seiki Co., Ltd.) at 19.6 kHz and 600 W for 2 minutes, thereby obtaining a conductive adhesive composition.

In the preparation, the content of the copper core/shell nanoparticles in the nonvolatile components except propylene carbonate was set at 85 mass-% (approximately 50% by volume).

(Formation of Conductive Adhesive Layer on Substrate)

A glass substrate (average thickness: 1 mm) with an ITO film formed thereon by sputtering was used as a substrate having a conductive film. The average film thickness of the ITO film was 0.2 µm. The substrate was cleaned for 5 minutes with oxygen plasma by a plasma asher, and the conductive adhesive composition was applied onto the surface attached with ITO by spin coating under the conditions of 1,000 rotations/min for 30 seconds, and dried on a hot plate at 100° C. for 5 minutes, whereby a conductive adhesive composition layer was formed. Subsequently, the resin in the conductive adhesive composition layer was cured by heating on a hot plate at 180° C. for 15 minutes, whereby a conductive adhesive layer was formed. The average thickness of the conductive adhesive layer as measured with a three-dimensional non-contact profilometer was 0.5 µm.

(Preparation of Conductive Ink)

A conductive ink (copper conductive ink) was prepared by weighing 55 g of copper oxide nanoparticles (average particle diameter: 70 nm, CIK Nanotek Corporation) and 45 g of γ-butyrolactone, and treating the same with an ultrasonic homogenizer (US-600, by Nippon Seiki Co., Ltd.) at 19.6 kHz and 600 W for 5 minutes.

(Coating and Drying)

The conductive ink prepared above was applied onto the glass substrate having an ITO film and a conductive adhesive layer formed thereon, with an applicator having a gap of 50 µm, thereby obtaining a substrate having a conductive ink layer (conductor layer-forming composition layer) on the conductive adhesive layer. The obtained substrate was dried on a hot plate at 150° C. for 10 minutes. A sample for a conductivity developing treatment was thus prepared.

(Formic Acid Gas Treatment)

Formic acid was placed in a gas-washing bottle and heated in an oil bath at 30° C. with nitrogen bubbling, which was used as a formic acid gas generator. A sample for the formic acid gas treatment was set on a 3 mm-thick copper plate placed at the bottom of a flat-bottom separable flask that was heated in an oil bath. A chromel-alumel thermocouple was set on the glass plate placed on the surface of the copper plate such that the treatment temperature at the sample could be measured. The separable flask with the sample was heated in an oil bath at 200° C. while introducing nitrogen, and when the sample temperature reached a plateau (185° C.), a nitrogen gas containing a formic acid gas generated in the formic acid gas generator was introduced into the separable flask to perform the treatment to the coated and dried conductive ink layer for 20 minutes. During the treatment, the color of the conductive ink layer of the sample changed from black to copper. After the treatment, the sample was left standing at 185° C. for 15 minutes under a nitrogen flow not containing formic acid, to remove formic acid. Then, the separable flask was chilled with water, and the sample was taken out in the air after the temperature of the sample became 50° C. or less.

(Measurement of Resistance)

The surface resistivity of the conductor layer formed from the conductive ink was measured with a 4-pin probe type low resistivity meter (LORESTA GP, Mitsubishi Chemical Corporation). The surface resistivity was 0.0092Ω/□. The thickness of the conductor layer formed from the conductive ink was determined by forming an incision in the conductor layer with a cutter knife, and measuring the depth of the incision at 10 points with a three-dimensional non-contact profilometer (MICROMAP MM3500, Ryoka Systems Inc.) and calculating the arithmetic mean of the measured values as the average thickness of the conductor layer. The average thickness was 10 μm, and the volume resistivity calculated based on the average thickness was $9.2 \times 10^{-8}$ Ω·m. The conduction between the conductor layer formed from the conductive ink and ITO was confirmed by removing a part of the conductor layer with a scraper to expose ITO and measuring with a tester (DC800a, Sanwa Electric Instrument Co., Ltd.) Although the measured value changes depending on the position of the probe on the ITO film due to the resistance of the ITO film itself, the measured values were generally approximately 0.3Ω and it was confirmed that the conduction at low resistance was obtained.

(Tape Peel Test)

The conductor layer formed from the conductive ink that had been subjected to the formic acid gas treatment had a double-layer structure including a compact layer having a metallic luster at the substrate side, and a brittle and powdery layer at the outer side. The powdery substance on the surface was wiped off gently with a paper towel (KIM-TOWEL, Nippon Paper Crecia Co., Ltd.), and the following tape peel test was conducted.

In the tape peel test, a cellophane tape was attached to the conductor layer side of the conductive substrate and pressed tightly with a finger, and then peeled off.

As a result, the conductor layer did not detach from the substrate, and it was judged that an excellent adhesion was achieved.

Example 2

Preparation of Sample

A substrate having a conductive ink layer on a conductive adhesive layer was obtained as a sample, in a similar manner to Example 1.

(Conductivity Developing Treatment)

The components shown in Table 1 were weighed and mixed to prepare a treatment liquid A as a reducing treatment liquid for a conductivity developing treatment. The substrate having a conductive ink layer was placed at the bottom of a dish, and a conductivity developing treatment was performed as a dip treatment, by pouring the treatment liquid A into the dish to allow the conductive ink layer to turn to a conductor layer. During the conductivity developing treatment at room temperature (20° C.) for 60 minutes, the color of the conductive ink layer that was initially black gradually changed to copper while it was bubbling.

TABLE 1

| Recipe of Treatment Liquid A | |
|---|---|
| Complexing agent 1 | 28% ammonia water |
| Concentration (mol/L) | 1 |
| Content (ml) | 27.37 |
| Complexing agent 2 | 2,2'-bipyridyl |
| Concentration (mol/L) | 0.01 |
| Content (ml) | 0.70 |
| Complexing agent 3 | EDTA |
| Concentration (mol/L) | 0.01 |
| Content (ml) | 1.32 |
| Reducing agent | dimethylamine borane |
| Concentration (mol/L) | 0.1 |
| Content (ml) | 2.65 |
| Solvent | pure water |
| Content (ml) | 417.96 |
| Total amount (g) | 450 |

(Volume Resistivity Measurement and Adhesion Evaluation)

The substrate having a conductor layer formed thereon was evaluated in a similar manner to Example 1. The surface resistivity of the conductor layer was 0.0093Ω/□ and the average film thickness of the conductor layer was 11 μm, and the volume resistivity of the conductor layer calculated from these results was $1.02 \times 10^{-7}$ Ω·m. The resistance between the conductor layer and the ITO film was 0.2Ω. A tape peel test was conducted in a similar manner to Example 1. As a result, the conductor layer did not detach from the substrate and excellent adhesion was confirmed.

Comparative Example 1

A sample was prepared in a similar manner to Example 1, except that a conductive adhesive layer was not formed from a conductive adhesive composition and a conductive ink layer was formed by applying a conductive ink directly on a glass substrate having an ITO film formed by sputtering. Subsequently, a conductor layer was formed by performing a formic acid gas treatment in a similar manner to Example 1.

(Measurement of Resistance)

The resistance of the conductor layer was measured in a similar manner to Example 1. As a result, the surface resistance value was 0.044Ω/□, the average thickness of the conductor layer was 5 μm, and the volume resistivity was $2.2 \times 10^{-7}$ Ω·m. The conduction between the conductor layer and the ITO was not able to confirm because the entire conductor layer peeled off upon removal with a scraper. The subsequent tape peel test was not performed accordingly, but it was judged that the adhesion of the conductor layer was extremely poor in view of the result that the entire conductor layer peeled off upon scratching with a scraper.

Comparative Example 2

A sample was prepared in a similar manner to Example 2, except that a conductive adhesive layer was not formed from a conductive adhesive composition and a conductive ink layer was formed by applying a copper conductive ink directly on a glass substrate having an ITO film formed by sputtering. Subsequently, a conductor layer was formed by performing a conductivity developing treatment with the treatment liquid A in a similar manner to Example 2.

(Volume Resistivity Measurement and Adherence Evaluation)

As a result of performing a conductivity developing treatment with the treatment liquid A, a conductor layer was formed on the substrate as a thin copper film. However, a major part of the conductive ink was lost by dissolving and deposition of metallic copper occurred also at the wall of the dish. The average thickness of the conductor layer was measured by forming an incision to the conductor layer formed on the substrate with a cutter knife, and measuring the depth of the incision with a stylus profilometer (XP-2, AMBiOS Technology, Inc.) The average thickness was 420 nm. The surface resistivity of the conductor layer as measured in a similar manner to Example 1 was 0.074Ω/□, and the volume resistivity calculated from these results was $3.1 \times 10^{-8}$ Ω·m. The tape peel test was performed in a similar manner to Example 1. As a result, the copper film as a conductor layer easily detached from the substrate.

Comparative Example 3

An adhesive substrate treatment agent was prepared by dissolving 0.5 g of dipropylene glycol diglycidyl ether (DER RESIN GR. 736, Polysciences, Inc.), 0.5 g of bisphenol A novolac epoxy resin (N865, DIC Corporation) and 0.54 g of bisphenol A novolac (VH-4170, DIC Corporation) in 32 g of propylene carbonate (Wako Pure Chemical Industries, Ltd.) In this preparation, conductive particles were not included in the adhesive substrate treatment agent.

A conductor layer was formed on the substrate in a similar manner to Example 1, except that the adhesive substrate treatment liquid obtained above was used instead of the conductive adhesive composition. Then, the conductor layer was evaluated in a similar manner to Example 1.

As a result, the average thickness of the adhesive layer was 0.4 μm, the surface resistivity of the conductor layer was 0.011Ω/□, the average thickness of the conductor layer was 5.7 μm, and the volume resistivity calculated from these results was $6.3 \times 10^{-8}$ Ω·m. The resistance between the conductor layer and the ITO film on the substrate was beyond the limit of measurement, i.e., the conduction was not established. This is thought to be due to the existence of a layer of an insulating adhesive substrate treatment agent, in which conductive particles (metal component) were not included, between the conductor layer and the ITO film.

In the tape peel test, the conductor layer did not detach and demonstrated favorable adhesion.

Example 3

Preparation of Conductive Adhesive Composition

A conductive adhesive composition (conductive adhesive layer-forming liquid) was prepared by mixing 45 g of copper oxide nanoparticles (average particle diameter: 70 nm, CIK Nanotek Corporation) and 5 g of copper nanoparticles having s naturally oxidized surface (average particle diameter: 50 nm, TEKNA Plasma Systems Inc.) with a solution prepared by dissolving 10.1 g of 30 mass-% propylene carbonate solution of bisphenol A novolac epoxy resin (N865, DIC Corporation), 0.366 g of bisphenol A novolac (VH-4170, by DIC Corporation) and 0.34 g of 1 mass-% solution of 2E4MZ (Shikoku Chemicals Corporation) in 39.2 g of propylene carbonate (Wako Pure Chemical Industries, Ltd.), and subjecting the mixture to a treatment with an ultrasonic homogenizer (US-600, Nippon Seiki Co., Ltd.) at 19.6 kHz and 600 W, for 2 minutes.

In this treatment, the content of the resins in the nonvolatile components except propylene carbonate was set at 6.8 mass-% (approximately 30% by volume).

Subsequent processes and evaluations including "Formation of Conductive Adhesive Layer on Substrate", "Preparation of Conductive Ink", "Coating and Drying", "Formic Acid Gas Treatment", "Measurement of Resistance" and "Tape Peel Test" were performed in a similar manner to Example 1, except that the conductive adhesive composition obtained above was used.

As a result, the average thickness of the conductive adhesive layer was 5, the surface resistivity of the conductor layer was 0.023Ω/□, the average thickness of the conductor layer formed from a conductive ink was 4.0 μm, and the volume resistivity calculated from these results was $9.2 \times 10^{-8}$ Ω·m. The resistance between the conductor layer and the ITO film on the substrate was 0.8Ω. In the tape peel test, the conductor layer formed from a conductive ink did not detach and demonstrated favorable adhesiveness.

Comparative Example 4

An adhesive substrate treatment agent was prepared by dissolving 10.1 g of 30 mass-% propylene carbonate solution of bisphenol A novolac epoxy resin (N865, DIC Corporation), 0.366 g of bisphenol A novolac (VH-4170, DIC Corporation) and 0.34 g of 1 mass-% solution of 2E4MZ (Shikoku Chemicals Corporation) in 39.2 g of propylene carbonate (Wako Pure Chemical Industries, Ltd.)

In this preparation, the adhesive components (binder) were the same as Example 3, but conductive particles (metal component) were not included.

A conductor layer was formed on the substrate in a similar manner to Example 1, except that the adhesive substrate treatment liquid obtained above was used instead of the conductive adhesive composition. Subsequently, the conductor layer was evaluated in a similar manner to Example 1.

As a result, the average thickness of the adhesive layer was 0.5 μm, the surface resistivity of the conductor layer formed from a conductive ink was 0.0089Ω/□, the average thickness of the conductor layer was 6.2 μm, and the volume resistivity calculated from these results was $5.5 \times 10^{-8}$ Ω·m.

During the measurement for surface resistance, the conductor layer peeled off and the subsequent measurement could not be performed. Accordingly, it was judged that the adhesion of the conductor layer was extremely poor.

Example 4

Preparation of Conductive Adhesive Composition

A conductive adhesive composition was prepared by mixing 1.8 g of copper/copper oxide core-shell nanoparticles (average particle diameter: 70 nm, Nisshin Engineering Inc.) with a solution prepared by dissolving 0.9 g of titanium tetraisopropoxide (Wako Pure Chemical Industries, Ltd.) and 0.33 g of diethanol amine (Wako Pure Chemical Industries, Ltd.) in 17.1 g of isopropyl alcohol, and subjecting the mixture to a treatment with an ultrasonic homogenizer (US-600, Nippon Seiki Co., Ltd.) at 19.6 kHz and 600 W for 2 minutes.

Subsequent processes and evaluations including "Formation of Conductive Adhesive Layer on Substrate", "Preparation of Conductive Ink", "Coating and Drying", "Formic Acid Gas Treatment", "Measurement of Resistance" and "Tape Peel Test" were performed in a similar manner to Example 1, except that the conductive adhesive composition obtained above was used.

As a result, the average thickness of the conductive adhesive layer was 0.2 μm, the surface resistivity of the conductor layer was 0.03Ω/□, the average thickness of the conductor layer was 1 μm, and the volume resistivity calculated from these results was $3 \times 10^{-8}$ Ω·m. The resistance between the copper conductive ink and the ITO on the substrate was 0.9Ω. In the tape peel test, the conductor layer did not detach and demonstrated favorable adhesion.

Example 5

A conductive adhesive composition was prepared by mixing 1.7 g of copper/copper oxide core-shell nanoparticles (average particle diameter: 70 nm, Nisshin Engineering Inc.) with a solution prepared by dissolving 0.9 g of tetramethoxysilane (Wako Pure Chemical Industries, Ltd.) and 0.02 g of triethylamine (Wako Pure Chemical Industries, Ltd.) in 17.1 g of isopropyl alcohol (Wako Pure Chemical Industries, Ltd.), and subjecting the mixture to a treatment with an ultrasonic homogenizer (US-600, Nippon Seiki Co., Ltd.) at 19.6 kHz and 600 W for 2 minutes.

Subsequent processes and evaluations including "Formation of Conductive Adhesive Layer on Substrate", "Preparation of Conductive Ink", "Coating and Drying", "Formic Acid Gas Treatment", "Measurement of Resistance" and "Tape Peel Test" were performed in a similar manner to Example 1, except that the conductive adhesive composition obtained above was used.

As a result, the average thickness of the conductive adhesive layer was 0.2 μm, the surface resistivity of the conductor layer was 0.045Ω/□, the thickness of the conductor layer was 2 μm, and the volume resistivity calculated from these results was $9.0 \times 10^{-8}$ Ω·m. The resistance between the conductor layer formed from a copper conductive ink and the ITO on the substrate was 3.4Ω. In the tape peel test, the conductor layer did not detach and demonstrated favorable adhesion.

Example 6

A conductive adhesive composition was prepared in a similar manner to Example 1, except that nickel nanoparticles (QSI-NANO NICKEL, number average particle size: 20 nm, Quantum Sphere Inc.) were used instead of the copper/copper oxide core-shell nanoparticles.

Subsequent processes and evaluations including "Formation of Conductive Adhesive Layer on Substrate", "Preparation of Conductive Ink", "Coating and Drying", "Formic Acid Gas Treatment", "Measurement of Resistance" and "Tape Peel Test" were performed in a similar manner to Example 1, except that the conductive adhesive composition obtained above was used.

As a result, the average thickness of the conductive adhesive layer was 0.6 μm, the surface resistivity of the conductor layer was 0.05Ω/□, the average thickness of the conductor layer was 1.2 μm, and the volume resistivity calculated from these results was $6.0 \times 10^{-8}$ Ω·m. The resistance between the conductor layer formed from a copper conductive ink and the ITO film on the substrate was 1.1Ω. In the tape peel test, the conductor layer did not detach and demonstrated favorable adhesion.

Example 7

A conductor layer was formed on the substrate in a similar manner to Example 1, except that an aluminum plate (thickness: 1 mm) cut into a size of 7 cm×7 cm was used instead of the glass substrate having an ITO film, and the evaluation was performed in a similar manner to Example 1.

As a result, the average thickness of the conductive adhesive layer was 0.5 μm, the surface resistivity of the conductor layer was 0.0082Ω/□, and the average thickness of the conductor layer was 4.3 μm. The resistance between the conductor layer formed from a conductive ink and the substrate was 0.01Ω. In the tape peel test, the conductor layer formed from a copper conductive ink did not detach and demonstrated favorable adhesion.

As shown above, a conductive substrate that exhibits superior adhesion and conductivity between a substrate and a conductor layer can be produced by forming a conductive adhesive layer and a conductor layer on a substrate having a conductive film, by using a conductive adhesive composition and a conductor layer-forming composition (conductive ink) that are included in the composition set of the invention.

The disclosure of Japanese Patent Application No. 2011-170083 is incorporated herein by reference in its entirety.

All the literature, patent literature, and technical standards cited herein are also herein incorporated to the same extent as provided for specifically and severally with respect to an individual literature, patent literature, and technical standard to the effect that the same should be so incorporated by reference.

The invention claimed is:

1. A kit comprising:
    a conductor layer-forming composition comprising a dispersing medium and inorganic particles comprising a metallic oxide; and
    a conductive adhesive composition comprising a binder and conductive particles having a number average particle size of from 1 nm to 500 nm.

2. The kit according to claim 1, wherein the inorganic particles comprising the metallic oxide are at least one selected from the group consisting of copper oxide particles and core-shell particles having a core of metallic copper and a shell of copper oxide.

3. The kit according to claim 1, wherein the conductive particles comprise at least one selected from the group consisting of copper, copper oxide, cuprous oxide, gold, gold oxide, platinum, platinum oxide, silver, silver oxide, palladium, palladium oxide, rhodium, rhodium oxide, nickel and nickel oxide.

4. The kit according to claim 1, wherein the binder is an organic binder, an inorganic binder, or a combination thereof.

5. The kit according to claim 1, wherein the binder is at least one organic binder selected from the group consisting of an epoxy resin, a polyimide resin, a polyamide resin, a polyamide-imide resin, a phenolic resin, an isocyanate resin, an acrylic resin, a resol resin, a siloxane resin and precursor compounds of these.

6. The kit according to claim 1, wherein the binder is at least one inorganic binder selected from the group consisting of silicon oxide, titanium oxide, zircon oxide, tungsten oxide, zinc oxide, chromium oxide and precursor compounds of these.

7. The kit according to claim 1, wherein the conductive particles having a number average particle size of from 1 nm to 100 nm.

8. The kit according to claim 1, wherein the conductive particles having a number average particle size of from 10 nm to 500 nm.

9. The kit according to claim 1, wherein the conductive particles having a number average particle size of from 50 nm to 500 nm.

10. The kit according to claim 1, wherein the conductor layer-forming composition is a liquid.

11. The kit according to claim 1, wherein the conductor layer-forming composition consists essentially of the dispersing medium and the inorganic particles comprising a metallic oxide.

12. The kit according to claim 1, wherein the conductor layer-forming composition consists essentially of the dispersing medium, the inorganic particles comprising a metallic oxide and, optionally, a surface tension adjuster, a thixotropy imparting agent, a thickener, and a reducing agent.

13. A conductive substrate made using the kit according to claim 1, comprising:
a substrate having a conductive film;
a conductive adhesive layer provided on the conductive film, the conductive adhesive layer being a cured product of the conductive adhesive composition; and
a conductor layer provided on the conductive adhesive layer, the conductor layer comprising a metal that is a reduced product of the conductor layer-forming composition.

14. The conductive substrate according to claim 13, wherein the conductor layer comprises metallic copper.

15. The conductive substrate according to claim 13, wherein the conductive film comprises at least one selected from the group consisting of aluminum, copper, silver, gold, platinum, nickel, tin, lead, palladium, indium tin oxide (ITO), indium zinc oxide (IZO), zinc tin oxide (ZTO), fluorine-doped tin oxide (FTO), $InO_2$, $SnO_2$ and ZnO.

16. The conductive substrate according to claim 13, wherein the conductor layer has a volume resistivity of from $1.5 \times 10^{-8}$ Ω·m to $1.0 \times 10^{-7}$ Ω·m, and wherein at least a part of the metal in the conductor layer is bonded by metal bonding with at least some of the conductive particles in the conductive adhesive layer.

17. The conductive substrate according to claim 13, wherein the average thickness of the conductor layer is 100 nm or more, and the average thickness of the conductive adhesive layer is from 10 nm to 2000 nm.

18. A method of producing the conductive substrate according to claim 13, the method comprising:
a process of forming a conductive adhesive composition layer by applying, onto a substrate having a conductive film, the conductive adhesive composition;
a process of forming a conductive adhesive layer by curing the binder in the conductive adhesive composition layer;
a process of forming a conductor layer-forming composition layer by applying, onto the conductive adhesive layer, the conductor layer-forming composition; and
a process of forming a conductor layer comprising a metal by reducing the metallic oxide in the conductor layer-forming composition layer.

\* \* \* \* \*